(12) United States Patent
Yoon et al.

(10) Patent No.: US 10,989,753 B2
(45) Date of Patent: Apr. 27, 2021

(54) SYSTEM FOR DIAGNOSING INSULATING ELEMENT IN BMS

(71) Applicant: LG Chem, Ltd., Seoul (KR)

(72) Inventors: Ho Byung Yoon, Daejeon (KR); Younghwan Kim, Daejeon (KR); Sang Hoon Lee, Daejeon (KR); Hujun Lee, Daejeon (KR)

(73) Assignee: LG Chem, Ltd.

( * ) Notice: Subject to any disclaimer, the term of this patent is extended or adjusted under 35 U.S.C. 154(b) by 196 days.

(21) Appl. No.: 16/088,316

(22) PCT Filed: Jul. 12, 2017

(86) PCT No.: PCT/KR2017/007477
§ 371 (c)(1),
(2) Date: Sep. 25, 2018

(87) PCT Pub. No.: WO2018/097444
PCT Pub. Date: May 31, 2018

(65) Prior Publication Data
US 2020/0011922 A1    Jan. 9, 2020

(30) Foreign Application Priority Data
Nov. 25, 2016 (KR) .......... 10-2016-0158504

(51) Int. Cl.
*G01R 31/12* (2020.01)
*G01R 31/382* (2019.01)
(Continued)

(52) U.S. Cl.
CPC ......... *G01R 31/1227* (2013.01); *G01R 31/14* (2013.01); *G01R 31/3648* (2013.01); *G01R 31/382* (2019.01)

(58) Field of Classification Search
CPC .... G01R 31/12; G01R 31/1227; G01R 31/14; G01R 31/382; G01R 31/3648; H02J 7/00; H01M 10/00; B60L 3/0069
(Continued)

(56) References Cited

U.S. PATENT DOCUMENTS

| 9,297,860 B2 | 3/2016 | Bertrand et al. |
| 9,711,977 B2 | 7/2017 | Kang et al. |

(Continued)

FOREIGN PATENT DOCUMENTS

| CN | 101499672 A | 8/2009 |
| CN | 101609127 A | 12/2009 |

(Continued)

OTHER PUBLICATIONS

Search report from International Application No. PCT/KR2017/007477, dated Sep. 1, 2017.
(Continued)

*Primary Examiner* — Melissa J Koval
*Assistant Examiner* — Joseph O Nyamogo
(74) *Attorney, Agent, or Firm* — Lerner, David, Littenberg, Krumholz & Mentlik, LLP

(57) ABSTRACT

The present invention relates to a system for diagnosing an insulation element within a battery management system (BMS), in which an input terminal and an output terminal of an insulation element obtain a battery pack diagnosis signal that is output through a battery monitoring circuit and passes through the insulation element, and then abnormality of the insulation element is diagnosed based on a bit operation value of the obtained battery pack diagnosis signal, or an input terminal and an output terminal of the insulation element obtain a transceived communication signal and then
(Continued)

abnormality of the insulation element is diagnosed based on a bit operation value of the obtained transceived communication signal.

15 Claims, 4 Drawing Sheets

(51) Int. Cl.
*G01R 31/14* (2006.01)
*G01R 31/36* (2020.01)

(58) Field of Classification Search
USPC ...................................... 326/62; 327/166–167
See application file for complete search history.

(56) References Cited

U.S. PATENT DOCUMENTS

| | | | |
|---|---|---|---|
| 2009/0198399 A1 | 8/2009 | Kubo et al. | |
| 2012/0016613 A1* | 1/2012 | Yang | G01R 27/16 702/65 |
| 2012/0119765 A1 | 5/2012 | Bracker et al. | |
| 2013/0314012 A1 | 11/2013 | Cho | |
| 2013/0335096 A1 | 12/2013 | Hasenkopf et al. | |
| 2015/0171487 A1 | 6/2015 | Itou et al. | |
| 2016/0003887 A1 | 1/2016 | Nagase | |
| 2016/0245874 A1* | 8/2016 | Kang | B60L 58/15 |
| 2016/0261124 A1* | 9/2016 | Kang | G01R 31/396 |

FOREIGN PATENT DOCUMENTS

| | | |
|---|---|---|
| CN | 101793944 A | 8/2010 |
| CN | 102004222 A | 4/2011 |
| CN | 202159120 U | 3/2012 |
| CN | 102467091 A | 5/2012 |
| CN | 103118897 A | 5/2013 |
| CN | 103424690 A | 12/2013 |
| JP | H04317216 A | 11/1992 |
| JP | H0711032 U | 2/1995 |
| JP | 2010078490 A | 4/2010 |
| JP | 2015114223 A | 6/2015 |
| JP | 2016015393 A | 1/2016 |
| KR | 101332871 B1 | 11/2013 |
| KR | 20130127828 A | 11/2013 |
| KR | 20140089481 A | 7/2014 |
| KR | 101623103 B1 | 5/2016 |
| KR | 20160047633 A | 5/2016 |

OTHER PUBLICATIONS

Chinese Search Report for Application No. 201780023938.7 dated Apr. 8, 2020, 3 pages.

* cited by examiner

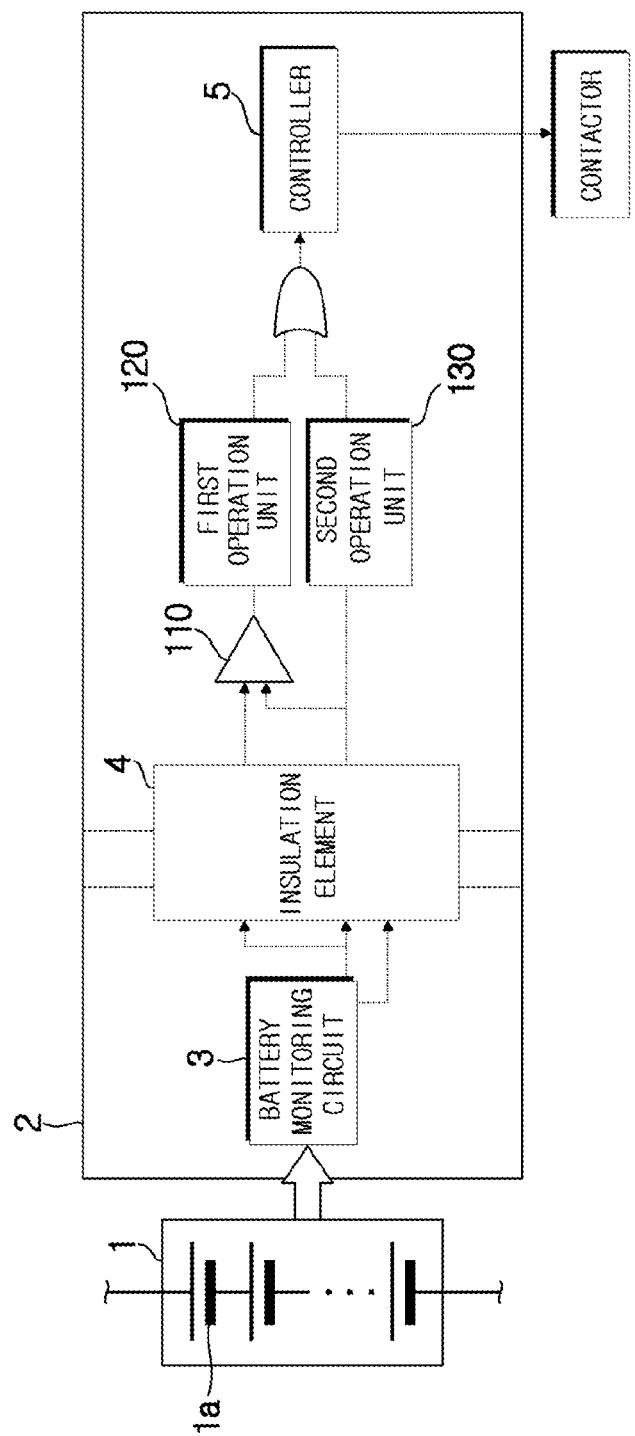
[Figure 1]

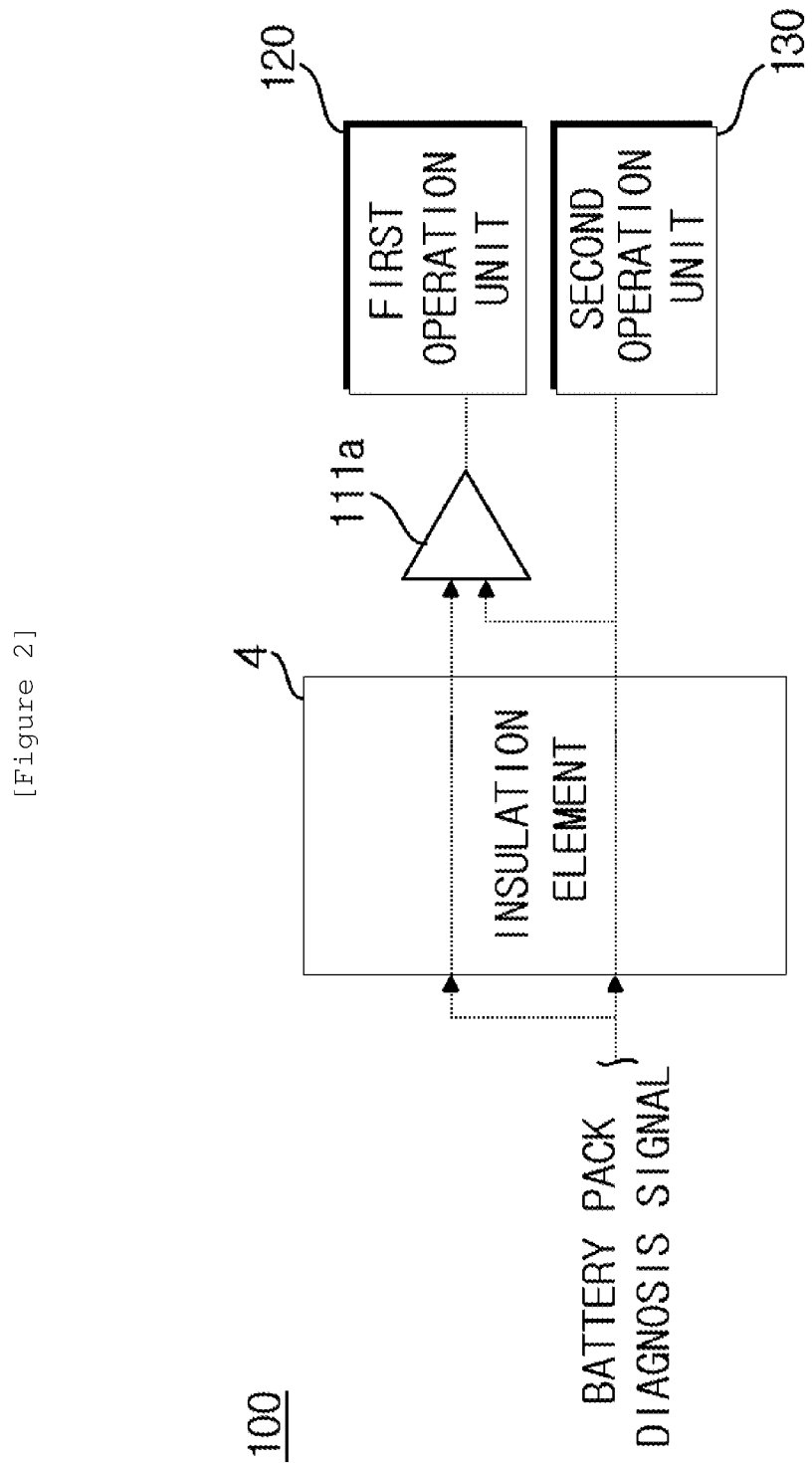

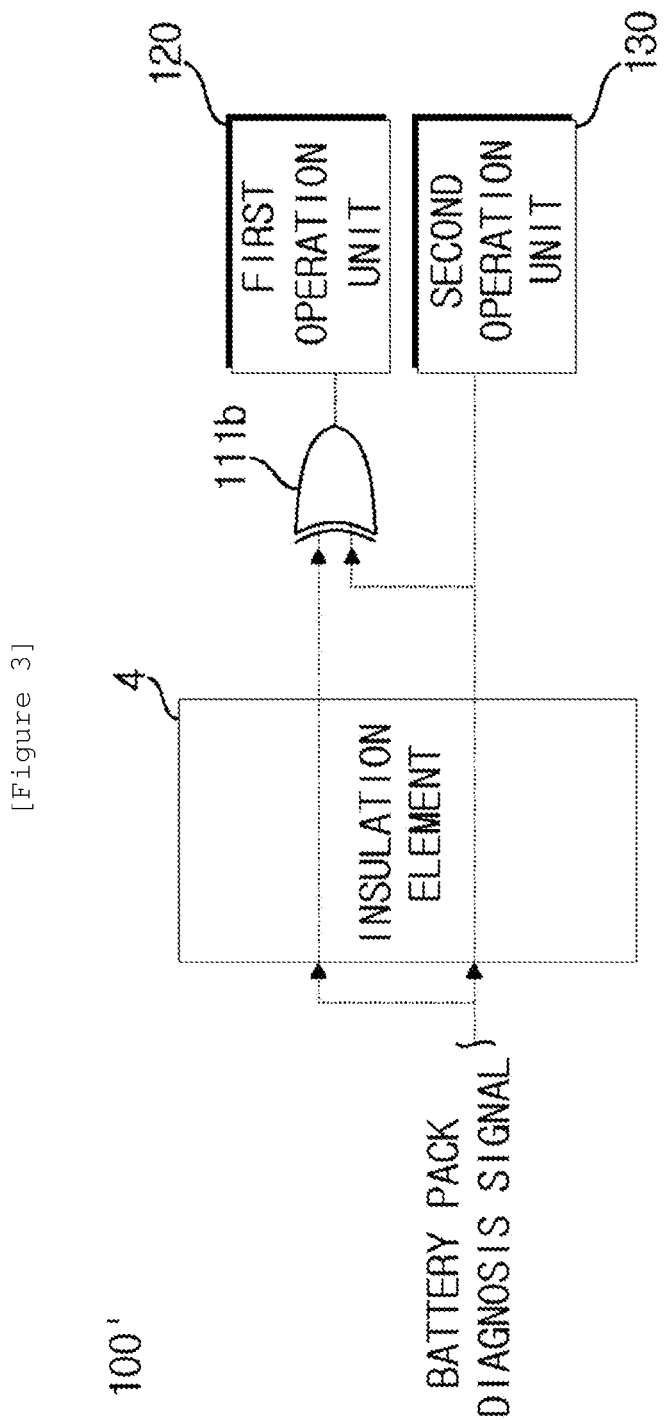
[Figure 3]

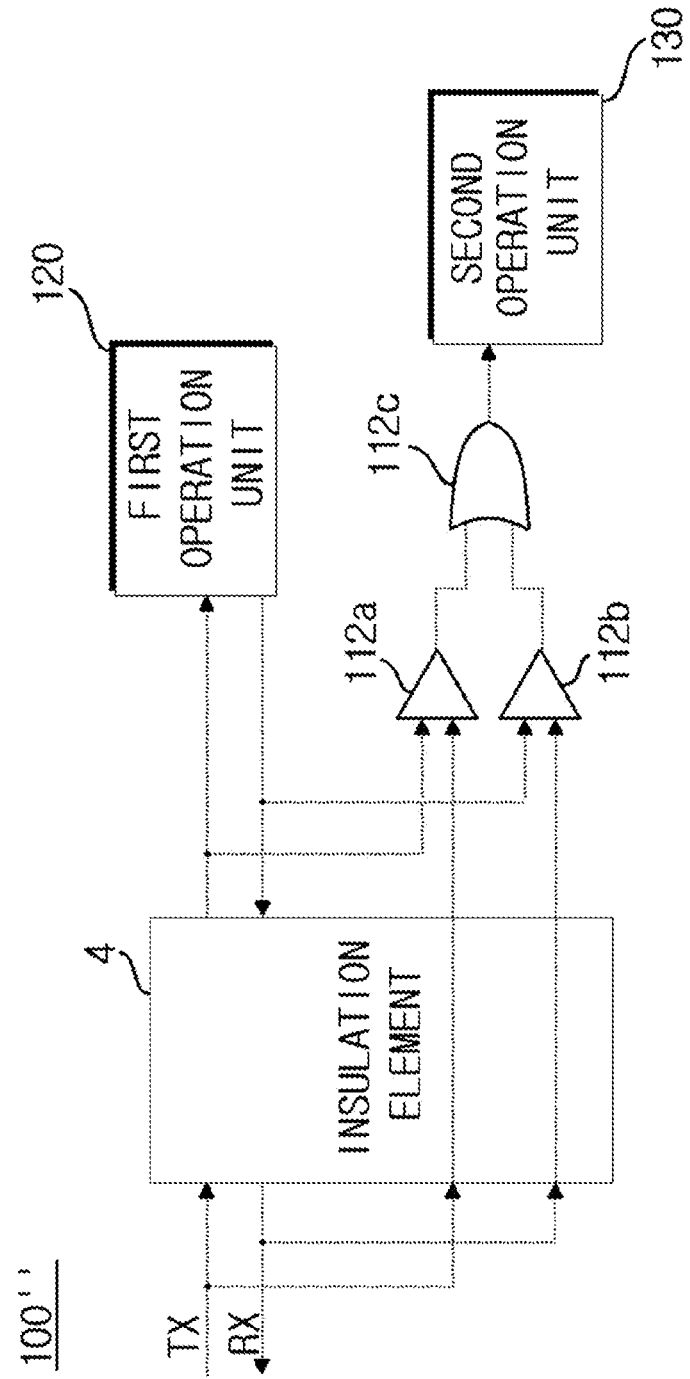
[Figure 4]

SYSTEM FOR DIAGNOSING INSULATING ELEMENT IN BMS

CROSS-REFERENCE TO RELATED APPLICATIONS

This application is a national phase entry under 35 U.S.C. § 371 of International Application No. PCT/KR2017/007477 filed on Jul. 12, 2017, which claims priority to Korean Patent Application No. 10-2016-0158504 filed on Nov. 25, 2016, the disclosures of which are incorporated herein by reference.

TECHNICAL FIELD

This application claims priority to and the benefit of Korean Patent Application No. 10-2016-0158504 filed in the Korean Intellectual Property Office on Nov. 25, 2016, the entire contents of which are incorporated herein by reference.

The present invention relates to a system for diagnosing an insulation element within a battery management system (BMS), and more particularly, to a system for diagnosing an insulation element within a BMS, in which when abnormality of an insulation element dividing a BMS according to a voltage region is diagnosed, an input terminal and an output terminal of an insulation element obtain a battery pack diagnosis signal that is output through a battery monitoring circuit and passes through the insulation element, and then abnormality of the insulation element is diagnosed based on a bit operation value of the obtained battery pack diagnosis signal, or an input terminal and an output terminal of the insulation element obtain a transceived communication signal and then abnormality of the insulation element is diagnosed based on a bit operation value of the obtained transceived communication signal.

BACKGROUND ART

In general, a battery management system (BMS) applied to an electric vehicle is connected with a battery pack including a plurality of battery cells to manage various battery states of the battery pack.

In this case, the BMS may be generally divided into a high-voltage region that is connected with a battery cell and senses a voltage of the battery cell, and a low-voltage region that is connected with a vehicle, and in this case, the high-voltage region and the low-voltage region maintain an insulation state by means of an insulation element interposed therebetween.

Further, various diagnosis information about the battery cell sensed in the high-voltage region may be transmitted to an operation processing unit (micro controller unit (MCU)) positioned in the low-voltage region through the insulation element. In this case, when abnormality is generated in the insulation element, an erroneous operation of the BMS, such as the opening of a contactor, may be caused due to a generation of a problem in the transmitted various diagnosis information of the battery cell, and there is no technology for autonomously diagnosing the generation of abnormality of the insulation element, so that actually, there is a problem in stability, such as explosion of a battery pack, due to a failure of the reception of a diagnosis result.

In this respect, in order to solve the problems and the limits of the insulation element to which the BMS is applied in the related art, the present inventors developed a system for diagnosing an insulation element within a BMS, in which an input terminal and an output terminal of an insulation element obtain a battery pack diagnosis signal that is output through a battery monitoring circuit and passes through the insulation element, and then abnormality of the insulation element is diagnosed based on a bit operation value of the obtained battery pack diagnosis signal, or an input terminal and an output terminal of the insulation element obtain a transceived communication signal and then abnormality of the insulation element is diagnosed based on a bit operation value of the obtained transceived communication signal.

Technical Problem

The present invention is conceived to solve the foregoing problems, and an object of the present invention is to provide a system for diagnosing an insulation element within a battery management system (BMS) in which when abnormality of an insulation element dividing a BMS according to a voltage region is diagnosed, an input terminal and an output terminal of an insulation element obtain a battery pack diagnosis signal that is output through a battery monitoring circuit and passes through the insulation element, and then abnormality of the insulation element is diagnosed based on a bit operation value of the obtained battery pack diagnosis signal, or an input terminal and an output terminal of the insulation element obtain a transceived communication signal and then abnormality of the insulation element is diagnosed based on a bit operation value of the obtained transceived communication signal.

Technical Solution

An exemplary embodiment of the present invention provides a system for diagnosing an insulation element within a battery management system (BMS), the system including: in a BMS divided into a first voltage region and a second voltage region by an insulation element, a comparing unit which compares an input signal input through an input terminal of the insulation element in the first voltage region with an output signal output to the second voltage region through an output terminal of the insulation element and then outputs a comparison result; and first and second operation units which determine whether the insulation element is erroneously operated based on the comparison result.

In the exemplary embodiment, the comparing unit may include at least one of a first comparing unit which compares a front-end battery diagnosis signal input through the input terminal of the insulation element in the first voltage region with a rear-end battery diagnosis signal output to the second voltage region through the output terminal of the insulation element and then provides a first operation unit within the BMS with a comparison result, and a second comparing unit which compares a communication signal for transmission transmitted from the first voltage region to the second voltage region through the insulation element with a communication signal for reception transmitted from the second voltage region to the first voltage region through the insulation element and then provides the second operation unit within the BMS with a comparison result.

In the exemplary embodiment, the first comparing unit may include at least one of: a first differential amplifying and comparing device which amplifies a difference between the obtained front-end battery diagnosis signal and the obtained rear-end battery diagnosis signal and then provides the first operation unit with an amplified result value; and a first adding and comparing device which adds a bit value of the obtained front-end battery diagnosis signal and a bit value of the obtained rear-end battery diagnosis signal and then provides the first operation unit with an added result value.

In the exemplary embodiment, the first differential amplifying and comparing device may be a differential amplifier (operational amplifier (OP AMP)) and the first adding and comparing device may be an XOR gate, and the bit value of the obtained front-end battery diagnosis signal and the bit value of the obtained rear-end battery diagnosis signal may be added by using an XOR gate circuit.

In the exemplary embodiment, when the result value amplified by the first differential amplifying and comparing device is less than a specific threshold value, the first operation unit may determine that the insulation element is erroneously operated.

In the exemplary embodiment, when the result value added by the first adding and comparing device corresponds to a high bit value corresponding to 1, the first operation unit may determine that the insulation element is erroneously operated.

In the exemplary embodiment, the second comparing unit may include: a second differential amplifying and comparing device which amplifies a difference between a communication signal for front-end transmission obtained through the input terminal of the insulation element and a communication signal for rear-end transmission obtained through the output terminal of the insulation element among the communication signals for transmission and then outputs an amplified result value; a third differential amplifying and comparing device which amplifies a difference between a communication signal for front-end reception obtained through the input terminal of the insulation element and a communication signal for rear-end reception obtained through the output terminal of the insulation element among the communication signals for reception and then outputs an amplified result value; and a second adding and comparing device which OR-operates the result value output from each of the second and third differential amplifying and comparing devices and then provides the second operation unit with an operated result value.

In the exemplary embodiment, the second and third differential amplifying and comparing devices may be differential amplifiers (OP AMPs), and the second adding and comparing device may be an OR gate.

In the exemplary embodiment, when the result value OR-operated by the second adding and comparing device corresponds to a high bit value corresponding to 1, the second operation unit may determine that the insulation element may be erroneously operated.

Advantageous Effects

According to one aspect of the present invention, an input terminal and an output terminal of an insulation element obtain a battery pack diagnosis signal that is output through a battery monitoring circuit and passes through the insulation element, and then abnormality of the insulation element is diagnosed based on a bit operation value of the obtained battery pack diagnosis signal, or an input terminal and an output terminal of the insulation element obtain a transceived communication signal and then abnormality of the insulation element is diagnosed based on a bit operation value of the obtained transceived communication signal, so that there is an advantage in that it is possible to diagnose the generation of abnormality of a communication function by using the insulation element in advance and improve stability of an operation of the BMS.

BRIEF DESCRIPTION OF DRAWINGS

FIG. 1 is a diagram schematically illustrating a configuration of a battery management system (BMS) 2 to which a system 100 for diagnosing an insulation element within a BMS according to an exemplary embodiment of the present invention is applied.

FIG. 2 is a diagram illustrating an exemplary embodiment of the system 100 for diagnosing an insulation element within a BMS illustrated in FIG. 1.

FIG. 3 is a diagram illustrating a configuration of a system 100' for diagnosing an insulation element within a BMS implemented through another exemplary embodiment of the system 100 for diagnosing an insulation element within a BMS illustrated in FIG. 2.

FIG. 4 is a diagram illustrating a configuration of a system 100" for diagnosing an insulation element within a BMS implemented through another exemplary embodiment of the system 100 and 100' for diagnosing an insulation element within a BMS illustrated in FIGS. 2 and 3.

BEST MODE

Hereinafter, an exemplary embodiment is presented for helping understanding of the present invention. However, the exemplary embodiment below is simply provided for easier understanding of the present invention, and the contents of the present invention are not limited by the exemplary embodiment.

FIG. 1 is a diagram schematically illustrating a configuration of a battery management system (BMS) 2 to which a system 100 for diagnosing an insulation element within a BMS according to an exemplary embodiment of the present invention is applied, and FIG. 2 is a diagram illustrating an exemplary embodiment of the system 100 for diagnosing an insulation element within a BMS illustrated in FIG. 1.

Referring to FIGS. 1 and 2, the system 100 for diagnosing an insulation element within a BMS according to the present invention may be provided inside the BMS 2 which obtains voltage information, temperature information, and the like of each battery cell 1a from a battery pack 1.

The BMS 2 may be generally divided into a first region and a second region through an insulation element 4, and in this case, the first region may mean a high-voltage region in which a battery monitoring circuit 3 is provided, and may mean a low-voltage region in which a comparing device 110, a first operation unit 120, a second operation unit 130, a controller 5, and the like according to the present invention are provided.

Herein, the first operation unit may be a central processing unit (micro controller unit (MCU)) which is capable of wirelessly communicating with the battery monitoring circuit 3, and the second operation unit 130 may mean a safe central processing unit (safe microcontroller unit) which receives a battery pack diagnosis signal from the battery monitoring circuit 3.

That is, the BMS 2 may be divided into the first region and the second region through the insulation element 4, the first region and the second region may correspond to insulation states, and all of various information about the battery cell 1a provided from the battery monitoring circuit 3 or a communication signal for communication with the first operation unit 120 may be transmitted from the first region to the second region, or from the second region to the first region through the insulation element 4.

In the meantime, the system 100 for diagnosing an insulation element within a BMS according to the present invention may have the configurations through various exemplary embodiments as illustrated in FIGS. 2 to 4, so that the system 100 will be described in more detail with reference to FIGS. 2 to 4.

FIG. 2 is a diagram illustrating an exemplary embodiment of the system 100 for diagnosing an insulation element within a BMS illustrated in FIG. 1, FIG. 3 is a diagram illustrating a configuration of a system 100' for diagnosing an insulation element within a BMS implemented through another exemplary embodiment of the system 100 for diagnosing an insulation element within a BMS illustrated in FIG. 2, and FIG. 4 is a diagram illustrating a configuration of a system 100" for diagnosing an insulation element within a BMS implemented through another exemplary embodiment of the system 100 and 100' for diagnosing an insulation element within a BMS illustrated in FIGS. 2 and 3.

The comparing device 110 of the system 100 for diagnosing an insulation element within a BMS illustrated in FIG. 2 may include a first comparing unit 111 which compares a front-end battery diagnosis signal input through an input terminal of the insulation element 4 in a first voltage region with a rear-end battery diagnosis signal output to a second voltage region through an output terminal of the insulation element 4, and then provides the first operation unit 120 with a comparison result.

The first comparing unit 111 may include a first differential amplifying and comparing device 111a which amplifies a difference between the obtained front-end battery diagnosis signal and the obtained rear-end battery diagnosis signal and then provides the first operation unit 120 with an amplified result value, or a first adding and comparing device 111b which adds a bit value of the obtained front-end battery diagnosis signal and a bit value of the obtained rear-end battery diagnosis signal and provides the first operation unit 120 with a result value of the addition as illustrated in FIG. 3.

That is, the system 100 of FIG. 2 has the same configuration as that of FIG. 3, but the first adding and comparing device 111b may be applied instead of the first differential amplifying and comparing device 111a of FIG. 2.

Herein, the first differential amplifying and comparing device 111a may mean a general differential amplifier (operational amplifier (OP AMP)), and the first adding and comparing device 111b may mean an exclusive OR gate (XOR gate).

The first differential amplifying and comparing device 111a may serve to amplify a difference between a front-end battery diagnosis signal and a rear-end battery diagnosis signal and then transmit the amplified value to the first operation unit 120, and when the result value amplified through the first differential amplifying and comparing device 111a is less than a specific threshold value, the first operation unit 120 determines that abnormality is generated in the insulation element 4.

Herein, the case where the result value amplified through the first differential amplifying and comparing device 111a is less than the specific threshold value means that there is no difference in a voltage between the first voltage region that is an input terminal side of the insulation element and the second voltage region that is an output terminal side of the insulation element, and may mean that the insulation is not properly performed, so that the first differential amplifying and comparing device 111a may be applied for detecting the improper insulation.

First, the first adding and comparing device 111b XOR-operates a low bit (0) and a high bit (1) that are bit values of the front-end battery diagnosis signal and a low bit (0) and a high bit (1) that are bit values of the rear-end battery diagnosis signal, so that when a result value of the operation is the high bit value corresponding to 1, it is determined that abnormality is generated in the insulation element 4.

Next, referring to FIG. 4, a system 100" for diagnosing an insulation element within a BMS illustrated in FIG. 4 may include a second comparing unit 112 which compares a communication signal TX for transmission transmitted from the first voltage region to the second voltage region through the insulation element with a communication signal RX for reception transmitted from the second voltage region to the first voltage region through the insulation element, and then provides the second operation unit 130 with a comparison result, instead of the first differential amplifying and comparing device 111a and the first adding and comparing device 111b included in FIGS. 2 and 3.

The second comparing unit 112 may include a second differential amplifying and comparing device 112a which amplifies a difference between a communication signal for front-end transmission obtained through the input terminal of the insulation element 4 and a communication signal for rear-end transmission obtained through the output terminal of the insulation element 4 among the communication signals for transmission transmitted to from the first voltage region to the first operation unit 120 through the insulation element 4 and then outputs an amplified result value, a third differential amplifying and comparing device 112b which amplifies a difference between a communication signal for front-end reception obtained through the input terminal of the insulation element 4 (herein, the input terminal may mean the output terminal through which the communication signal for rear-end transmission is output) and a communication signal for rear-end reception obtained through the output terminal of the insulation element 4 (herein, the output terminal may mean the input terminal to which the communication signal for front-end transmission is input) among the communication signals for transmission transmitted from the second voltage region to the first voltage region through the insulation element 4 and then outputs an amplified result value, and a second adding and comparing device 112c which OR-operates the result value output from each of the second and third differential amplifying and comparing devices 112a and 112b and then provides the second operation unit 130 with an operated result value.

Herein, similar to the first differential amplifying and comparing device 111a, the second and third differential amplifying and comparing devices 112a and 112b may be differential amplifiers (OP AMPs), and the second adding and comparing device 112c may be an OR gate.

Accordingly, the second and third differential amplifying and comparing devices 112a and 112b amplify the difference between the communication signal for front-end transmission and the communication signal for rear-end transmission and the difference between the communication signal for front-end reception and the communication signal for rear-end reception, respectively, and then transmit the amplified values to the second adding and comparing unit 112c.

The second adding and comparing device 112c OR-operates the bit values of the amplified values and determines that abnormality is generated in the insulation element 4 when a result value of the operation is the high bit value corresponding to 1.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A system for diagnosing an insulation element within a battery management system (BMS), wherein the BMS includes a battery monitoring circuit positioned in a first voltage region of the BMS and configured to monitor a battery in the first voltage region, and a controller positioned in a second voltage region and configured to receive diagnosis information about the battery from the battery monitoring circuit, wherein the first voltage region is electrically insulated from a second voltage region of the BMS by the insulation element, and wherein the insulation element includes an input terminal in the first voltage region and an output terminal in the second voltage region, the system comprising:
 a comparing unit positioned in the second voltage region and configured to compare a first signal indicative of a voltage at the input terminal of the insulation element with a second signal indicative of a voltage at the output terminal of the insulation element and then output a first comparison result indicative of a voltage difference between the input terminal and the output terminal; and
 a first operation unit positioned in the second voltage region and configured to determine whether the insulation element is defective based on the first comparison result and to diagnose failure of the controller to receive the diagnosis information about the battery from the battery monitoring circuit based on whether the insulation element is defective.

2. The system of claim 1, wherein the first signal is a front-end battery diagnosis signal input through the input terminal of the insulation element in the first voltage region, and wherein the second signal is a rear-end battery diagnosis signal output to the second voltage region through the output terminal of the insulation element, and wherein the comparing unit is configured to output the first comparison result to the first operation unit.

3. The system of claim 2, wherein the comparing unit includes at least one of:
 a differential amplifying and comparing device configured to amplify a difference between the first signal and the second signal and output the amplified difference as the first comparison result; or
 an adding and comparing device configured to add a bit value of the first signal and a bit value of the second signal and output the sum of the bit values as the first comparison result.

4. The system of claim 3, wherein the comparing unit includes a differential amplifying and comparing device, and wherein the differential amplifying and comparing device is an operational amplifier (OP AMP).

5. The system of claim 3, wherein the comparing unit includes a differential amplifying and comparing device, and wherein the first operation unit is configured to determine that the insulation element is defective based on the amplified difference being less than a predetermined threshold value.

6. The system of claim 3, wherein the comparing unit includes an adding and comparing device, and wherein the first operation unit is configured to determine that the insulation element is defective based on the sum of the bit values equaling 1.

7. The system of claim 1, wherein the comparing unit is further configured to:
 compare a first communication signal transmitted from the first voltage region to the second voltage region through the insulation element with a second communication signal transmitted from the second voltage region to the first voltage region through the insulation element; and
 output a second comparison result, and
wherein the first operation unit is configured to determine whether the insulation element is defective based on the first and second comparison results.

8. The system of claim 7, wherein the comparing unit includes:
 a first differential amplifying and comparing device configured to amplify a difference between the first signal and the second signal;
 a second differential amplifying and comparing device configured to amplify a difference between the first communication signal and the second communication signal; and
 an adding and comparing device configured to OR-operatec outputs from each of the first and second differential amplifying and comparing devices and provide an operated result value to the first operation unit.

9. The system of claim 8, wherein the first and second differential amplifying and comparing devices are OP AMPs, and the adding and comparing device is an OR gate.

10. The system of claim 8, wherein the first operation unit is configured to determine that the insulation element is defective based on the operated result value equaling 1.

11. The system of claim 3, wherein the comparing unit includes an adding and comparing device, and wherein the adding and comparing device is an XOR gate configured to add the bit value of the first signal and the bit value of the second signal.

12. The system of claim 3, wherein the comparing unit includes both a differential amplifying and comparing device and an adding and comparing device, wherein the differential amplifying and comparing device is an operational amplifier (OP AMP), wherein the adding and comparing device is an XOR gate.

13. The system of claim 7, further comprising a second operation unit positioned in the second voltage region and configured to receive the first signal and to transmit the second communication signal, wherein the comparing unit is configured to receive the second communication signal from the second operation unit.

14. The system of claim 8, further comprising a second operation unit positioned in the second voltage region and configured to receive the first signal and to transmit the second communication signal, wherein the second differential amplifying and comparing device is configured to receive the second communication signal from the second operation unit.

15. The system of claim 1, wherein the first voltage region is a high-voltage region, and wherein the second voltage region is a low-voltage region.

* * * * *